US009934863B2

United States Patent
Griffin et al.

(10) Patent No.: US 9,934,863 B2
(45) Date of Patent: *Apr. 3, 2018

(54) DYNAMICALLY ADJUSTING READ VOLTAGE IN A NAND FLASH MEMORY

(71) Applicant: International Business Machines Corporation, Armonk, NY (US)

(72) Inventors: Thomas J. Griffin, Salt Point, NY (US); Steven J. Hnatko, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/404,739

(22) Filed: Jan. 12, 2017

(65) Prior Publication Data

US 2017/0169893 A1 Jun. 15, 2017

Related U.S. Application Data

(63) Continuation of application No. 14/969,196, filed on Dec. 15, 2015, now Pat. No. 9,659,664.

(51) Int. Cl.
| | |
|---|---|
| *G11C 16/28* | (2006.01) |
| *G11C 16/10* | (2006.01) |
| *G11C 16/34* | (2006.01) |
| *G11C 11/56* | (2006.01) |
| *G06F 11/10* | (2006.01) |
| *G11C 29/52* | (2006.01) |

(52) U.S. Cl.
CPC .......... *G11C 16/28* (2013.01); *G11C 11/5628* (2013.01); *G11C 11/5642* (2013.01); *G11C 16/10* (2013.01); *G11C 16/349* (2013.01); *G11C 16/3427* (2013.01); *G06F 11/1068* (2013.01); *G11C 29/52* (2013.01)

(58) Field of Classification Search
CPC .................................................. G11C 11/5642
USPC ...................................................... 365/185.18
See application file for complete search history.

(56) References Cited

U.S. PATENT DOCUMENTS

| 6,735,116 B2 | 5/2004 | Lee et al. |
| 7,849,383 B2 | 12/2010 | Lin |
| 8,035,811 B2 | 10/2011 | Silbergleit et al. |

(Continued)

OTHER PUBLICATIONS

Griffin et al., "Dynamically Adjusting Read Voltage in a NAND Flash Memory" U.S. Appl. No. 14/969,196, filed Dec. 15, 2015.

(Continued)

*Primary Examiner* — Min A Huang
(74) *Attorney, Agent, or Firm* — Martin & Associates, LLC; Derek P. Martin

(57) ABSTRACT

A NAND flash memory device detects the occurrence of Cell Voltage Distribution Disruption Events (CVDDEs), such as a Partial Block Program (PBP) and Program-Read-Immediate (PRI), and provides a way to dynamically adjust read voltage to account for CVDDEs. A read command includes extended addressing bits that are used when a CVDDE has occurred to access registers that indicate an adjustment to read voltage that is needed to accommodate the CVDDE. The read voltage is then dynamically adjusted to accommodate the CVDDE. When the CVDDE is no longer an issue, the read voltage is adjusted to its previous value before the CVDDE.

14 Claims, 9 Drawing Sheets

(56) References Cited

U.S. PATENT DOCUMENTS

| | | |
|---|---|---|
| 8,040,725 B2 | 10/2011 | Kang |
| 8,345,487 B2 | 1/2013 | Kim et al. |
| 8,760,951 B2 | 6/2014 | Park |
| 8,923,066 B1 | 12/2014 | Subramanian et al. |
| 9,037,950 B2 | 5/2015 | Kong et al. |
| 9,659,664 B1* | 5/2017 | Griffin .................. G11C 16/26 |
| 9,691,488 B1* | 6/2017 | Griffin .................. G11C 16/26 |
| 2010/0149872 A1* | 6/2010 | Aoyagi ............... G11C 11/5642 |
| | | 365/185.03 |
| 2014/0136765 A1* | 5/2014 | Oh .................... G11C 16/0483 |
| | | 711/103 |
| 2015/0262694 A1 | 9/2015 | Seo et al. |
| 2016/0118129 A1* | 4/2016 | Muchherla ............ G11C 16/26 |
| | | 365/185.12 |
| 2016/0118137 A1* | 4/2016 | Zhang .................. G11C 16/30 |
| | | 365/185.09 |
| 2016/0163392 A1* | 6/2016 | Zhao .................... G11C 16/10 |
| | | 365/185.03 |

OTHER PUBLICATIONS

Griffin et al., "Dynamically Adjusting Read Voltage in a NAND Flash Memory" U.S. Appl. No. 15/065,779, filed Mar. 9, 2016.
Griffin et al., "Dynamically Adjusting Read Voltage in a NAND Flash Memory" U.S. Appl. No. 14/424,716, filed Feb. 3, 2017.
Appendix P—List of IBM Patents or Patent Applications Treated As Related, dated Mar. 1, 2017.

* cited by examiner

800

| CVDDE Occurrence Table | | | | | | |
|---|---|---|---|---|---|---|
| Device | Block | Page Region | Page Type | CVDDE0 | ... | CVDDEN |
| 0 | 0 | 0 | 0 | 0/1 | | 0/1 |
| | . | 0 | 1 | | | |
| | . | 1 | 0 | | | |
| | . | 1 | 1 | | | |
| | 0 | . | . | | | |
| | . | . | . | | | |
| | . | . | . | | | |
| | . | p | 0 | | | |
| 0 | b | p | 1 | | | |
| | | . | 0 | | | |
| | | . | 1 | | | |
| | . | . | . | | | |
| | b | | . | | | |
| | | | . | | | |
| . | . | . | . | . | . | . |
| . | . | . | . | . | . | . |
| | 0 | 0 | 0 | | | |
| d | . | 0 | 1 | | | |
| | . | 1 | 0 | | | |
| | . | 1 | 1 | | | |
| | 0 | . | . | | | |
| | . | . | . | | | |
| | . | p | 0 | | | |
| d | b | p | 1 | | | |
| | . | . | 0 | | | |
| | . | . | 1 | | | |
| | . | . | . | | | |
| | b | . | . | 0/1 | | 0/1 |

FIG. 8

| CVDDE V$_{READ}$ Configuration Table |||||||
|---|---|---|---|---|---|---|
| Page Region | Page Type | CVDDE V$_{READ}$ Shift0 | ... | CVDDE V$_{READ}$ ShiftN | CVDDE V$_{READ}$ Addr1 | ... | CVDDE V$_{READ}$ AddrX |
| 0 | 0 | 0xFFFDFA | | 0xFFFEFE | 0xFFFDFA | | 0xFFFEFE |
| 0 | 1 | | | | | | |
| 1 | 0 | | | | | | |
| 1 | 1 | | | | | | |
| . | . | | | | | | |
| . | . | | | | | | |
| . | . | | | | | | |
| p | 0 | | | | | | |
| p | 1 | | | | | | |
| . | 0 | | | | | | |
| . | 1 | | | | | | |
| . | . | | | | | | |
| . | . | | | | | | |
| . | . | | | | | | |
| . | . | | | | | | |
| . | . | | | | | | |
| . | . | | | | | | |
| 0 | 0 | | | | | | |
| 0 | 1 | | | | | | |
| 1 | 0 | | | | | | |
| 1 | 1 | | | | | | |
| . | . | | | | | | |
| . | . | | | | | | |
| . | . | | | | | | |
| p | 0 | | | | | | |
| p | 1 | | | | | | |
| . | 0 | | | | | | |
| . | 1 | | | | | | |
| . | . | | | | | | |
| . | . | | | | | | |
| . | . | 0xFAF8FA | | 0xFEFEFC | 0xFAF8FA | | 0xFEFEFC |

FIG. 9

| | Address | CVDDE Offset |
|---|---|---|
| For Pages 1-2175 | 5 byte address | 0 |

| | Address | CVDDE Offset |
|---|---|---|
| For Pages 2176-2186 | 5 byte address | 0xn112 |

| | Address | CVDDE Offset |
|---|---|---|
| For Pages 2177-2187 | 5 byte address | 0xn113 |

DYNAMICALLY ADJUSTING READ VOLTAGE IN A NAND FLASH MEMORY

BACKGROUND

1. Technical Field

This disclosure generally relates to flash memory, and more specifically relates to dynamically adjusting read voltage in a NAND flash memory.

2. Background Art

Flash memory is a particular type of non-volatile storage, meaning flash memory does not required power to retain data. NAND flash memory is a particular type of flash memory that defines blocks of data that can be written without writing the entire memory. While NOR flash memory typically provides the capability of writing much smaller blocks, even down to the byte level, NAND flash memory provides much greater density and therefore less cost per bit when compared to NOR flash memory. NAND flash memory has become very popular in applications such as MP3 audio players, digital cameras, and universal serial bus (USB) drives.

There are different types of NAND flash memory according to the storage capability of each flash memory cell. Single-Level per Cell (SLC) can store two distinct states per cell. Multi-Level per Cell (MLC) can store four distinct states per cell. Three-Level per Cell (TLC) can store eight distinct states per cell. The states of the cell are a function of voltage stored on the floating gates of the cell. Thus, a MLC NAND flash memory can store four distinct voltage levels on a cell that are each interpreted as values of two bits in the memory.

SUMMARY

A NAND flash memory device detects the occurrence of Cell Voltage Distribution Disruption Events (CVDDEs), such as a Partial Block Program (PBP) and Program-Read-Immediate (PRI), and provides a way to dynamically adjust read voltage to account for CVDDEs. A read command includes extended addressing bits that are used when a CVDDE has occurred to access registers that indicate an adjustment to read voltage that is needed to accommodate the CVDDE. The read voltage is then dynamically adjusted to accommodate the CVDDE. When the CVDDE is no longer an issue, the read voltage is adjusted to its previous value before the CVDDE.

The foregoing and other features and advantages will be apparent from the following more particular description, as illustrated in the accompanying drawings.

BRIEF DESCRIPTION OF THE DRAWING(S)

The disclosure will be described in conjunction with the appended drawings, where like designations denote like elements, and:

FIG. 8 is a block diagram showing one suitable example of a CVDDE occurrence table;

FIG. 9 is a block diagram showing one suitable example of a CVDDE $V_{READ}$ configuration table;

DETAILED DESCRIPTION

The disclosure and claims herein relate to a NAND flash memory device that detects the occurrence of Cell Voltage Distribution Disruption Events (CVDDEs), such as a Partial Block Program (PBP) and Program-Read-Immediate (PRI), and provides a way to dynamically adjust read voltage to account for CVDDEs. A read command includes extended addressing bits that are used when a CVDDE has occurred to access registers that indicate an adjustment to read voltage that is needed to accommodate the CVDDE. The read voltage is then dynamically adjusted to accommodate the CVDDE. When the CVDDE is no longer an issue, the read voltage is adjusted to its previous value before the CVDDE.

Figure 1:
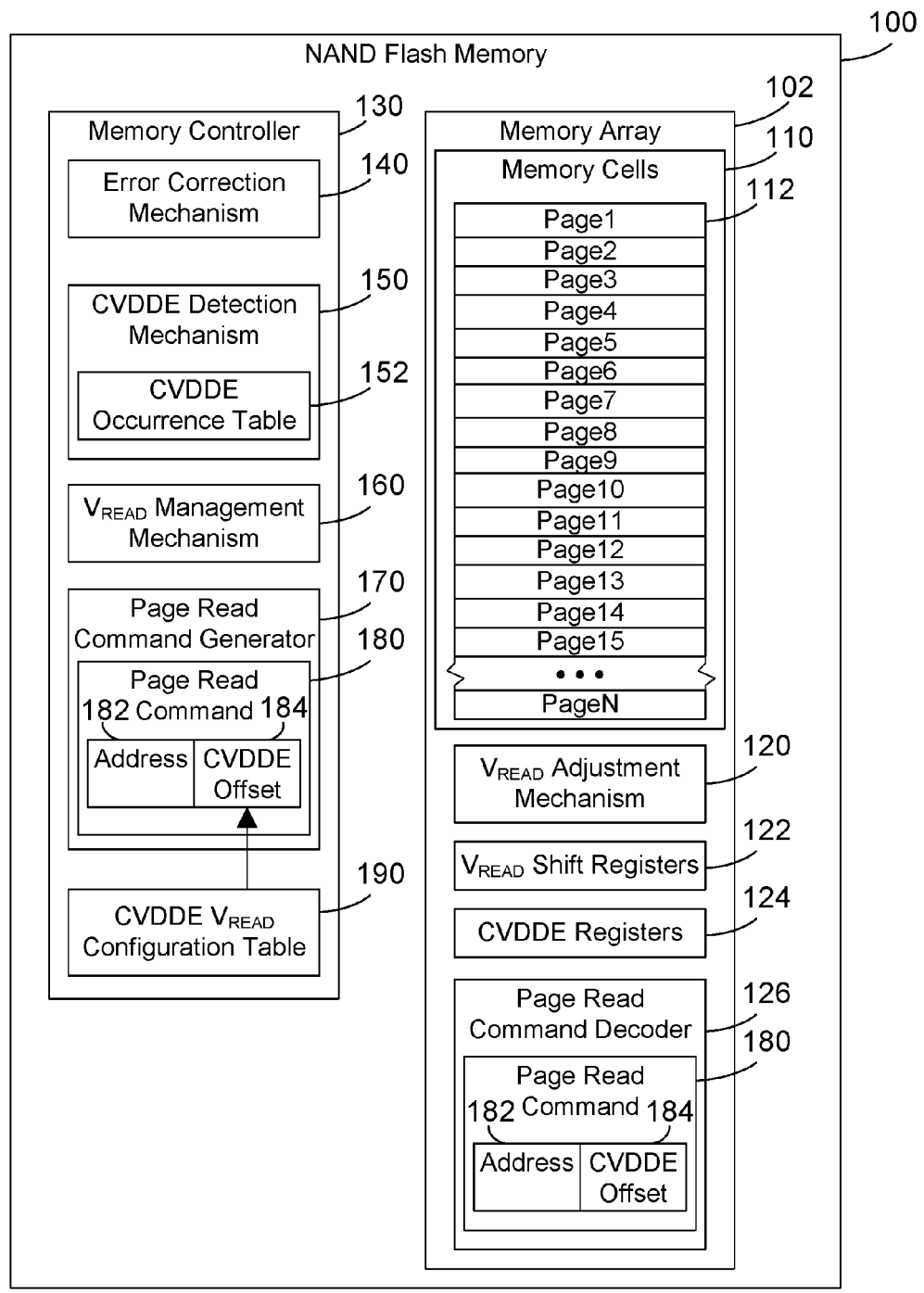
FIG. 1 is a block diagram of a NAND flash memory that dynamically adjusts read voltage to account for Cell Voltage Distribution Disruption Events (CVDDEs)

Referring to FIG. 1, a NAND flash memory 100 in accordance with the disclosure and claims herein includes a memory array 102 that includes plurality of memory cells 110 organized into a plurality of pages 112, shown in FIG. 1 as Page1 through Page15, ... PageN. A $V_{READ}$ adjustment mechanism 120 dynamically adjusts the read voltage according to values stored in $V_{READ}$ shift registers 122 and CVDDE registers 124. The values stored in the $V_{READ}$ shift registers 122 are values that shift $V_{READ}$ to account for wear and differences in memory cells on the device. The values stored in the CVDDE registers 124 are values that shift $V_{READ}$ to account for CVDDEs. The values stored in the CVDDE registers 124 are typically many times greater than the values stored in the $V_{READ}$ shift registers 122, but are at least twice the minor adjustments to $V_{READ}$ stored in the $V_{READ}$ shift registers 122 that account for wear or differing characteristics of memory cells across the device.

The $V_{READ}$ adjustment mechanism 120 can make an adjustment to read voltage as a result of the page read decoder 126 processing a page read command 180 that includes an address 182 and a CVDDE offset 184. When the page read command 180 does not have a CVDDE offset 184 or when the page read command 180 has a CVDDE offset 184 with a null value, no additional adjustment to read voltage due to CVDDE is performed by the $V_{READ}$ adjustment mechanism 120. When a page read command 180 includes a CVDDE offset 184 that is not null, the CVDDE offset 184 identifies one of the CVDDE registers 124 the $V_{READ}$ adjustment mechanism 120 uses to adjust read voltage. Note the magnitude of adjustments needed due to CVDDEs is significantly greater than the magnitude of adjustments needed due to wear or differences in memory cells, typically many times greater. Thus, the CVDDE registers 124 preferably contain adjustments to $V_{READ}$ that are many times greater in magnitude than the adjustments to $V_{READ}$ in the $V_{READ}$ shift registers 122. The values in the CVDDE registers 124 preferably include adjustments to $V_{READ}$ that are at least twice the magnitude of values in the $V_{READ}$ shift registers 122.

A memory controller 130 includes an error correction mechanism 140, a CVDDE detection mechanism 150, a $V_{READ}$ management mechanism 160, a page read command generator 170 and a CVDDE $V_{READ}$ configuration table 190. The error correction mechanism 140 checks data read from the memory cells 110 to determine whether the data contains any errors. When the data contains errors, the error correction mechanism 140 takes corrective action to correct errors in the data. Any suitable type of error detection and error correction could be performed by the error correction mechanism 140. The CVDDE detection mechanism 150 detects occurrence of Cell Voltage Distribution Disruption Events (CVDDEs), and logs the location of the CVDDE occurrence in a CVDDE occurrence table 152. Examples of known CVDDEs include a Partial Block Program (PBP) and Program-Read-Immediate (PRI). A partial block program occurs when part but not all of a defined block in the flash memory device is programmed. A Program-Read-Immediate occurs when a memory cell is programmed, then immediately followed by a read. Programming a memory cell requires some time for the charge on the floating gate to become evenly distributed on the floating gate. Reading immediately after programming can result in reading before the charge is evenly distributed on the floating gate, which thus requires a different value of $V_{READ}$ for a read immediately after programming than a normal read. A CVDDE is broadly defined herein to mean any event or condition that can cause a needed adjustment to $V_{READ}$ that is more than twice than the minor adjustments to $V_{READ}$ due to wear or differing characteristics of memory cells across the device. The disclosure and claims herein expressly extend to any CVDDE, whether currently known or discovered in the future.

The $V_{READ}$ management mechanism 160 programs the $V_{READ}$ shift registers 122 and CVDDE registers 124 with appropriate values so the $V_{READ}$ adjustment mechanism 120 can make the needed adjustments to read voltage based on the values stored in the $V_{READ}$ shift registers 122 and CVDDE registers 124. The page read command generator 170 generates page read commands 180 that include an address 182 and may optionally include a CVDDE offset 184. The CVDDE offset 184 is considered an extended address. When the CVDDE detection mechanism 150 detects the occurrence of a CVDDE, the page read command generator 170 generates a page read command 180 that includes a CVDDE offset 184 that identifies which CVDDE register 124 to use for the page read command. When the page read command decoder 126 receives the page read command 180 from the memory controller 130, it reads the CVDDE offset 184. The $V_{READ}$ adjustment mechanism 120 then knows to apply the adjustment to the read voltage specified in the CVDDE register 124 identified in the CVDDE offset 184.

The CVDDE offset 184 can be missing for page reads that do not need a CVDDE adjustment to $V_{READ}$. In the alternative, the CVDDE offset 184 can be present for all page reads, with some defined value, such as all zeroes or all ones, defining a null value that represents no adjustment to $V_{READ}$ is needed, while other non-null values represent an adjustment that needs to be made to $V_{READ}$ due to a CVDDE. In one specific implementation, the CVDDE offset 184, when not null, references one of the CVDDE registers 124. The CVDDE offset 184 is determined by reading the CVDDE $V_{READ}$ configuration table 190. Thus, when a page read command is received by the memory controller 130, the memory controller 130 checks the CVDDE occurrence table 152 to determine whether the address referenced in the page read command has been affected by a CVDDE, and when it has, the memory controller 130 reads the CVDDE $V_{READ}$ configuration table 190 to determine which CVDDE register 124 corresponds to the address of the page read command. The page read command generator 170 then generates a page read command 180 with the address 182 and the appropriate CVDDE register 124 specified in the CVDDE offset 184. In this manner a page read command 180 includes a CVDDE offset 184 that identifies a CVDDE register that specifies an adjustment to $V_{READ}$ that needs to be made during the read. Different page read commands 180 can include different CVDDE offsets 184, thereby allowing customizing adjustments to $V_{READ}$ according to the address of the memory cells being accessed by the page read command. When the memory array receives the page read command 180, the page read command decoder 126 determines whether the CVDDE offset 184 includes a non-null value, and if so, the $V_{READ}$ adjustment mechanism 120 adjusts the read voltage according to the value in the CVDDE register 124 specified in the CVDDE offset 184 of the page read command 180.

Figure 2:
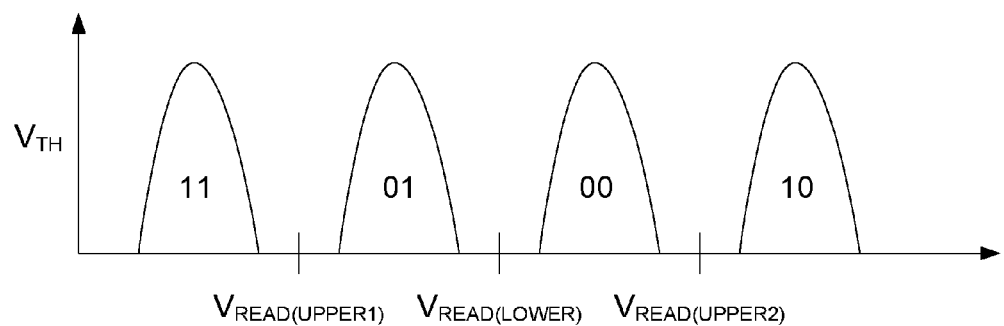
FIG. 2 is a graph showing read voltage in a Multi-Level per Cell (MLC) NAND flash memory where four different voltage levels are interpreted as two bits in the flash memory.

Referring to FIG. 2, a graph of read voltage ($V_{READ}$) is shown as a function of the threshold voltage $V_{TH}$ read from a memory cell for a Multi-Level per Cell (MLC) NAND flash memory cell. Note a cell can be programmed to one of four threshold voltage $V_{TH}$ states. As a result, each cell can represent two bits of storage. Because NAND flash memory could have the least significant bit (LSB) and most significant bit (MSB) switched, in this example we assume a lower page is associated with the LSB while an upper page is associated with the MSB. Thus, for a range of pages in a block, a distinct lower page is always coupled with a distinct upper page in that both share the same set of bitline cells, meaning they occupy the same wordline. $V_{READ(LOWER)}$ is the $V_{TH}$ read voltage that distinguishes the state of the LSB. $V_{READ(UPPER1)}$ and $V_{READ(UPPER2)}$ are the $V_{TH}$ read voltages that distinguish the state of the MSB. Note the distribution of cell states shown in FIG. 2 is ideal, meaning they are evenly spaced with the appropriate $V_{READ}$ voltages midway between cell states.

Figure 3:
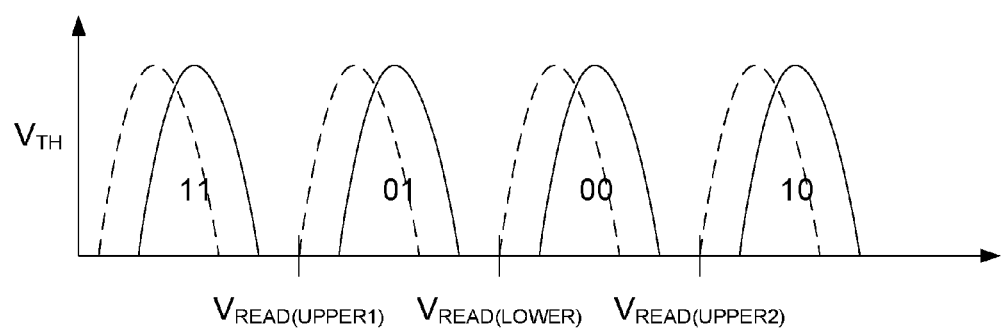
FIG. 3 is a graph illustrating how CVDDEs can cause a shift in read voltage.

The number of programming cycles in a NAND flash memory device can cause the $V_{READ}$ voltage to shift slightly as a function of the number of programming cycles, which is referred to as "wear" in a NAND flash memory device. However, CVDDEs can cause a more abrupt and drastic shift in the $V_{READ}$ voltage, as shown by the dotted lines in FIG. 3. When a CVDDE occurs, the existing methods for dealing with adjustments to read voltage in a NAND flash memory device create significant delays, as described in more detail below with reference to FIG. 6.

Figure 4:
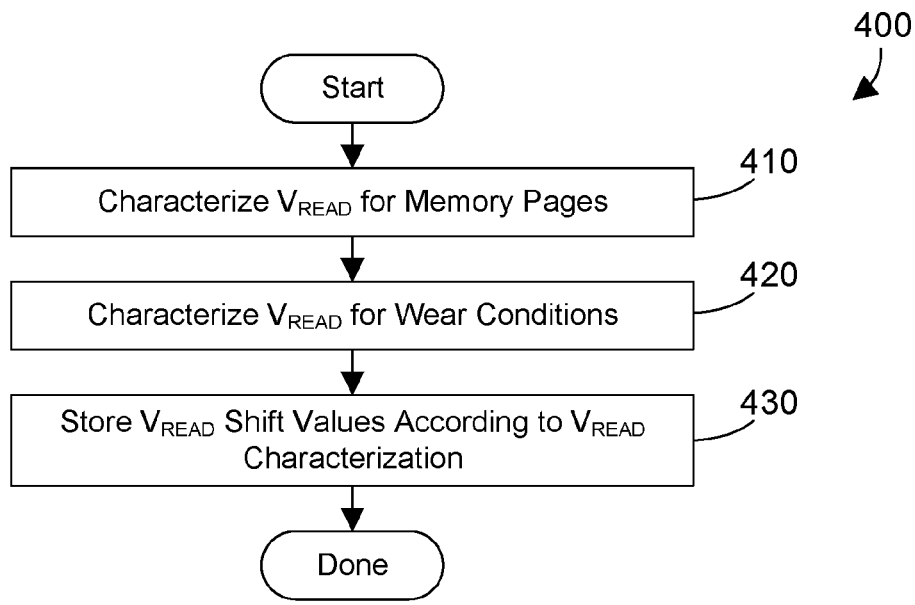
FIG. 4 is a flow diagram of a method for determining and storing shift values for read voltage in a NAND flash memory device.

Referring to FIG. 4, a method 400 represents a method for known NAND flash memory devices. $V_{READ}$ is characterized for the various pages in the memory (step 410). $V_{READ}$ is also characterized for wear conditions in the memory (step 420). Values are then stored in the $V_{READ}$ shift registers 122 according to the $V_{READ}$ characterization in steps 410 and 420 (step 430). This characterization of the memory device in method 400 allows customizing shift values for $V_{READ}$ that account for differences across the array of memory cells and across various wear conditions.

Figure 5:
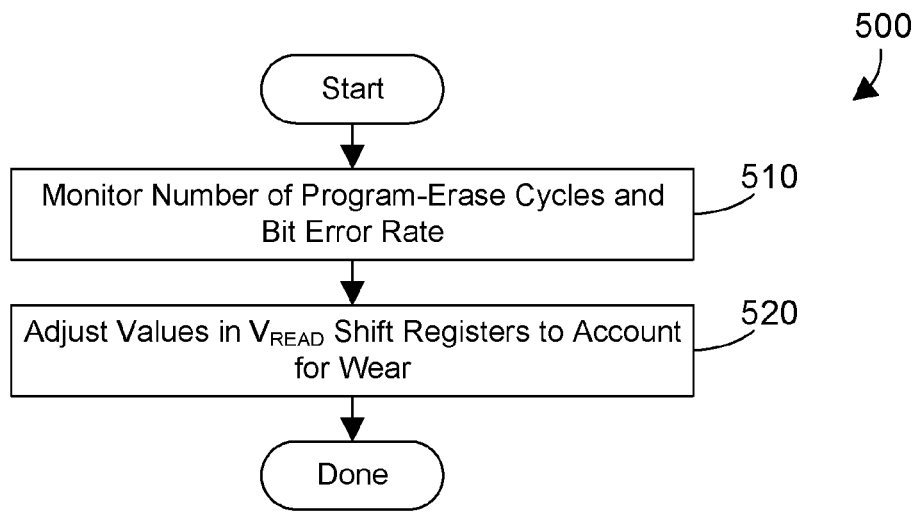
FIG. 5 is a flow diagram of a method for shifting values for read voltage to account for wear in a NAND flash memory device.

Referring to FIG. 5, a method 500 represents a method for known NAND flash memory devices. The number of program-erase cycles and the bit error rate is monitored (step 510), and the values in the $V_{READ}$ shift registers are adjusted to account for wear (step 520), meaning the number of program-erase cycles. It is a known phenomenon that NAND flash memory cells exhibit wear, meaning as the number of program-erase cycles increases, the $V_{READ}$ voltage shifts. The characterization of the device in method 400 in FIG. 4 is done when the device is new and has undergone very few write cycles. The method 500 in FIG. 5 simply adjusts the $V_{READ}$ shift values to account for wear.

Figure 6:
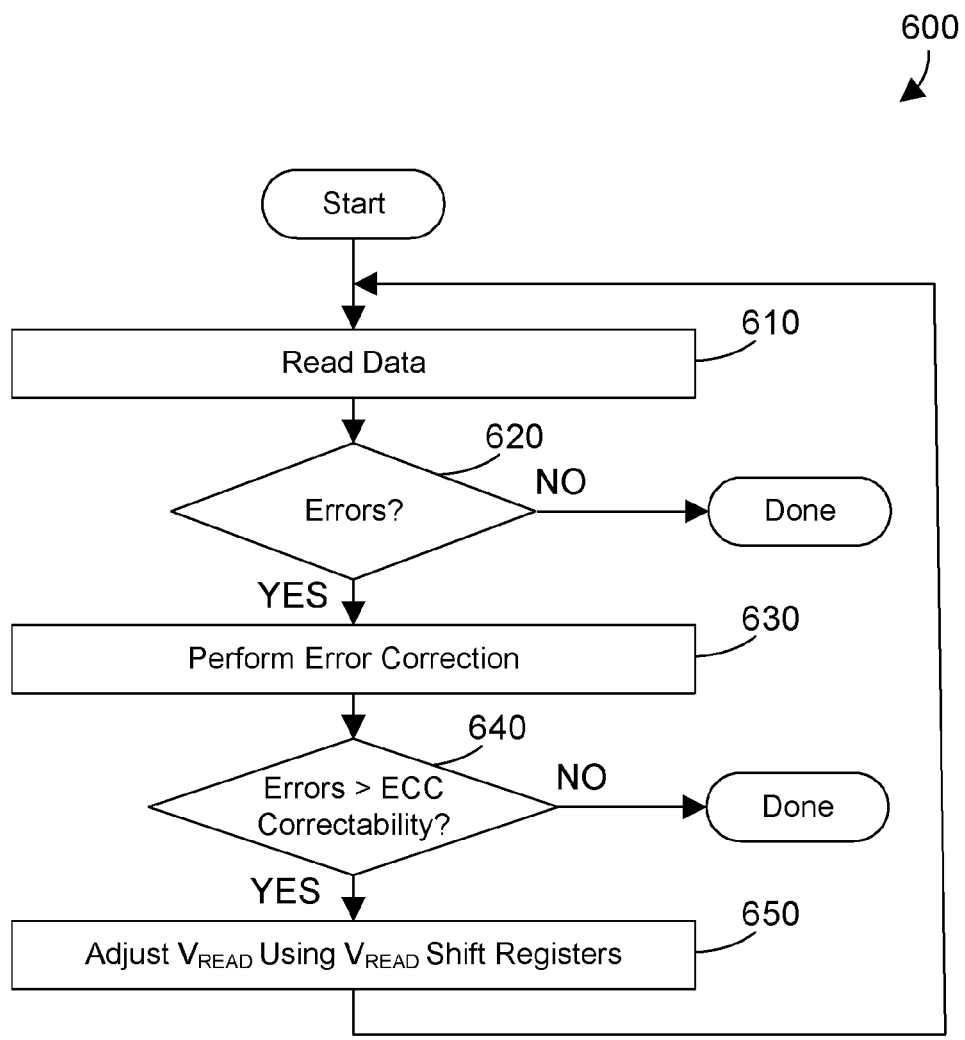
FIG. 6 is a flow diagram of a method for adjusting read voltage in a NAND flash memory device.

Referring to FIG. 6, a method 600 represents a method for known NAND flash memory devices to adjust $V_{READ}$ when errors are detected. Data is read (step 610). When there are no errors in the read data (step 620=NO), method 600 is done. When there are errors in the read data (step 620=YES), error correction is performed (step 630). If the number of errors does not exceed capability of the error correction (ECC correctability) in step 630 (step 640=NO), method 600 is done. If the number of errors exceeds ECC correctability after the error correction in step 630 (step 640=YES), the read voltage $V_{READ}$ is adjusted using values in the $V_{READ}$ shift registers (step 650). Method 600 works well for minor changes to $V_{READ}$, such as those caused by differences between different memory cells on the same device or those caused by gradual wear. However, a CVDDE can require a more significant change to $V_{READ}$, typically many times greater than a change needed due to wear. In the case of a CVDDE, method 600 will result in multiple iterations before arriving at a read that does not have any errors. because the $V_{READ}$ shift values adjust the read voltage by a relatively small amount instead of a larger amount needed for a CVDDE. These multiple iterations in method 600 can cause a significant time delay in performing the read when a CVDDE has occurred. The existing methods for adjusting $V_{READ}$, while suitable for accounting for differences in cells across the device and gradual wear, are not suitable for adjusting $V_{READ}$ due to CVDDEs. As a result, the NAND flash memory device described and claimed herein includes a mechanism for adjusting $V_{READ}$ for CVDDEs in addition to the known methods for adjusting $V_{READ}$ to account for cell differences and wear.

Figure 7:
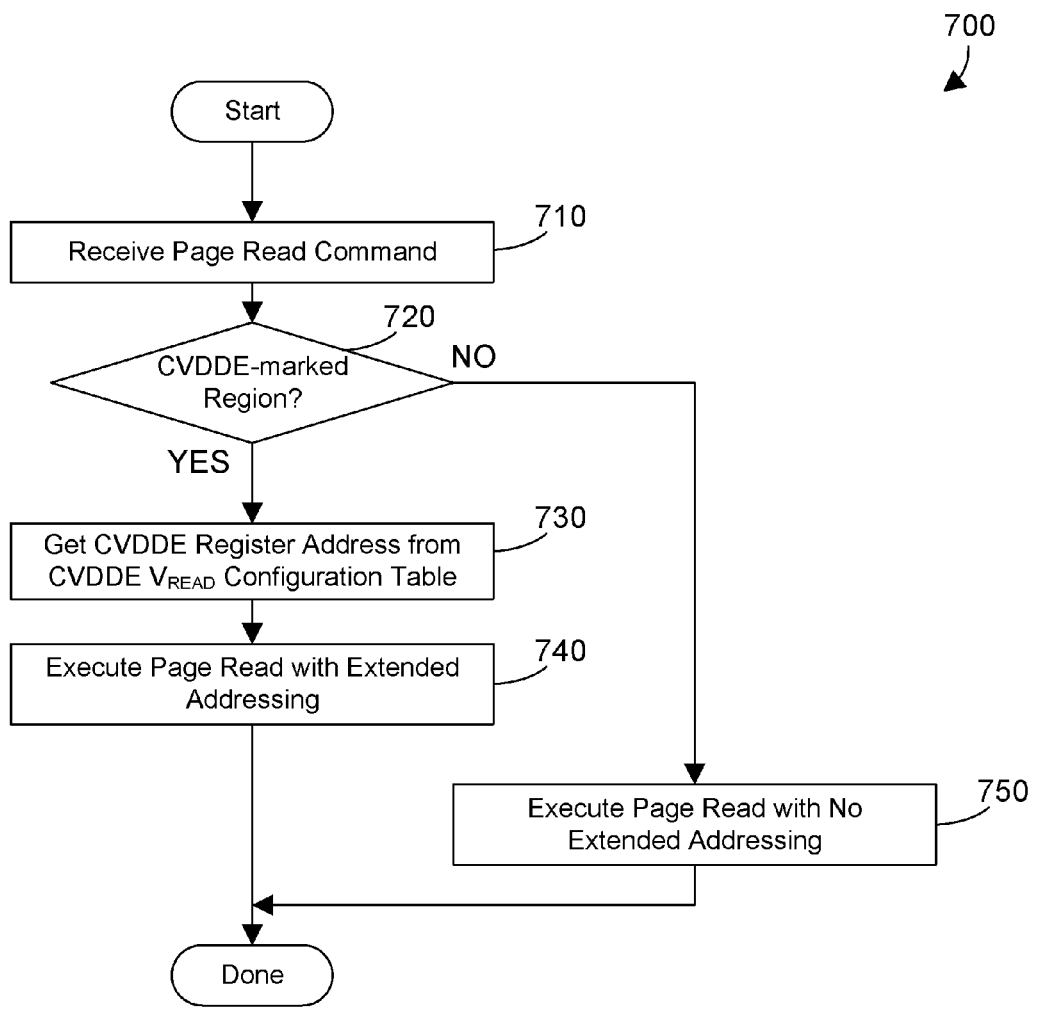
FIG. 7 is a flow diagram of a method for determining when a page read command accesses a region of the NAND flash memory that is marked as having a CVDDE, and in response, executing a page read with extended addressing.

Methods 400, 500 and 600 in FIGS. 4-6 are preferably performed in the NAND flash memory device 100 in FIG. 1. However, the NAND flash memory device 100 additionally includes different mechanisms for dealing with CVDDEs. Referring to FIG. 7, method 700 begins when a page read command is received (step 710). Method 700 is preferably performed by the memory controller 130 shown in FIG. 1. When the page read command references a region of the memory that has not been marked as having been affected by a CVDDE (step 720=NO), the page read is executed with no extended addressing (step 750). When the page read command references a region of the memory that has been marked as having been affected by a CVDDE (step 720=YES), the CVDDE register address is read from the CVDDE $V_{READ}$ configuration table (step 730). The page read command generator 170 then generates a page read command 180 with extended addressing (step 740), meaning the extended address (or CVDDE offset) references the CVDDE register address to use in adjusting the read voltage $V_{READ}$. Method 700 is then done. The page read command 180 generated by the page read command generator 170 is then sent to the page read command decoder 126, which processes the page read command 180, determines the page read command 180 and determines the page read command 180 has a CVDDE offset 184 (extended addressing) that identifies one of the CVDDE registers 124. In response, the $V_{READ}$ adjustment mechanism 120 adjusts the read voltage by the amount specified in the CVDDE register 124 specified in the CVDDE offset 184.

In the discussion above, when a page read command 180 has a CVDDE offset 184 that is not null, the $V_{READ}$ adjustment mechanism 120 reads the CVDDE offset 184, which identifies one of the CVDDE registers 124, and uses the value in the identified CVDDE register 124 to adjust the read voltage. However, other implementations are possible within the scope of the disclosure and claims herein. For example, instead of using the value in the CVDDE register directly, the $V_{READ}$ adjustment mechanism 120 could copy the value from the CVDDE register into a $V_{READ}$ shift register 122. In this case, the value in the $V_{READ}$ shift register would need to be saved before it is overwritten with the value from the identified CVDDE register so it can be restored after the page read command that includes the CVDDE offset has been processed. These and other variations are within the scope of the disclosure and claims herein.

Referring to FIG. 8, a table 800 is one suitable implementation of the CVDDE occurrence table 152 shown in FIG. 1. Based on desired geographic granularity of CVDDE tracking, the memory controller 120 sets up CVDDE occurrence table 800 to record whether a CVDDE has occurred (e.g., Partial Block Program), or is imminent (e.g., Program-Read-Immediate). In this example, the granularity is PageType (0=Lower, 1=Upper) per PageRegion (0-p) per Block (0-b) per Device (0-d) within a flash module. If a CVDDE has occurred or is imminent in a certain geography entry in the table, the controller marks the appropriate CVDDE column with a '1'. If the controller sees that a Page Read is about to occur within CVDDE-marked region, it will then parse the associated CVDDE $V_{READ}$ Configuration Table for the CVDDE register address in the flash device that contains the pre-programmed $V_{READ}$ shift values to be used for the given CVDDE.

Referring to FIG. 9, a table 900 is one suitable implementation of the CVDDE $V_{READ}$ configuration table 190 shown in FIG. 1. Based on desired geographic granularity of CVDDE tracking, the memory controller 120 sets up and maintains the CVDDE $V_{READ}$ Configuration Table 900. In this example, the geographic granularity is PageType (0=Lower, 1=Upper) per PageRegion (0-p) across all Blocks and Devices with in a flash module. Each entry in the Table contains a set of $V_{READ}$ shift values per CVDDE occurrence type (0-x), and an associated register address per CVDDE occurrence type. The $V_{READ}$ management mechanism 160 programs all the CVDDE $V_{READ}$ shift values into the respective CVDDE registers 124 either upon power-up, or upon occurrence of a CVDDE. Waiting to program the CVDDE registers 124 upon occurrence of a CVDDE allows for more accurate $V_{READ}$ shift values to be stored in the CVDDE registers 124. In this example, a CVDDE $V_{READ}$ shift entry is a concatenation of three byte-wide shift values consistent with the three $V_{READ}$ shift values associated with an MLC flash memory device. The controller 130 could maintain additional instances of this table containing different $V_{READ}$ shift values that are applicable based on the wear of the flash. The controller 130 decides when overall flash wear dictates the swap to a new table and the re-program of the CVDDE registers 124.

Figures 10, 11, 12, 13:
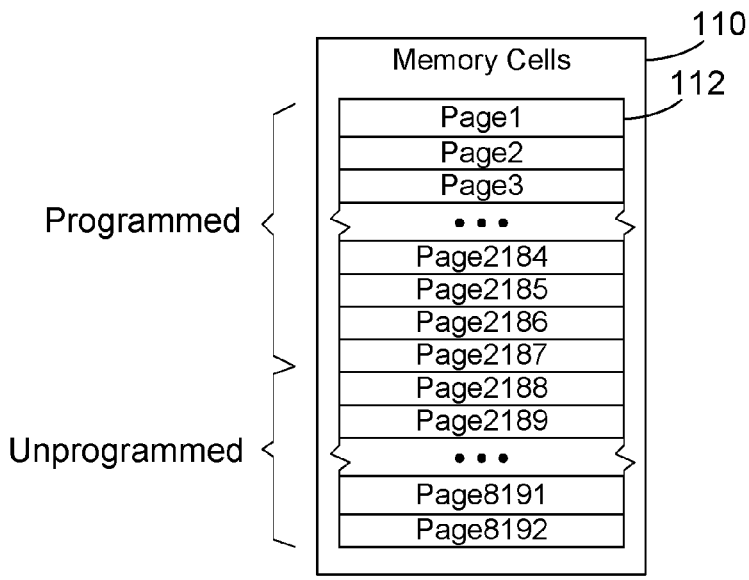
FIG. 10 is a block diagram showing one specific example of a Partial Block Program (PBP)
FIG. 11 shows a page read command that does not include a CVDDE offset (extended addressing)
FIG. 12 shows a page read command that includes a CVDDE offset (extended addressing) that identifies a first CVDDE register that contains an appropriate read voltage or adjustment to the read voltage to account for the CVDDE.
FIG. 13 shows a page read command that includes a CVDDE offset (extended addressing) that identifies a second CVDDE register that contains an appropriate read voltage or adjustment to the read voltage to account for the CVDDE.

A simple example is now provided to illustrate some of the concepts discussed above. We assume for this example a Partial Block Program (PBP) has occurred, which is a CVDDE event. We assume there are a total of 8192 pages in the flash memory device, as shown in FIG. 10, and that sequential programming has stopped at page 2187. The CVDDE Occurrence Table is divided into 512 16-page regions (Page Regions numbered 0-511) for each Block in each Device. Pages 2176 through 2191 are in Page Region 136. The memory controller 120 parses the CVDDE Occurrence Table 142 and notes that Page Region 136 in Block 37 of Device 3 has CVDDE0 (where CVDDE0 is defined as PBP), marked for both Page Types 0 (Lower Page in this example) and 1 (Upper Page in this example). The controller parses the CVDDE $V_{READ}$ Configuration Table 190 for Page Region 136 and gets the CVDDE register addresses for Page Types 0 and 1. Page Type 0 (Lower) for Page Region 136 is address 0x112, where 0x112 had been pre-programmed with the value 0xFCF9F3. Page Type 1 (Upper) for Page Region 136 is address 0x113, where 0x113 had been pre-programmed with the value 0xFAF5EF. As the controller progresses through the reading on Block 37 of Device 3, it sends out the normal Page Read command sequence up to page 2175, five address cycles between the Page Read Start and Page Read Terminate Command cycles where each cycle represents a byte of data. This normal page read command can be a page read command without extended addressing, or could be a page read command with extended addressing that includes a null value, such as the page read command shown in FIG. 11. For page 2176 and subsequent Lower pages up to 2186 (2176, 2178, 2180, 2182, 2184, 2186), the controller issues a page read command that includes an extended address that contains 0xn112, three nibbles for CVDDE register address 0x112 and another nibble n for optional bits, as shown in the page read command in FIG. 12. For page 2177 and subsequent Upper pages up to 2187 (2177, 2179, 2181, 2183, 2185, 2187), the controller issues a page read command that includes an extended address that contains 0xn113, three nibbles for CVDDE register address 0x113 and another nibble n for optional bits, as shown in the page read command in FIG. 13. One of the optional bits can be used to indicate to the flash module that the $V_{READ}$ shift values programmed into the CVDDE registers should be used as an absolute $V_{READ}$ value (e.g., when the bit is a zero) or as an offset to the current steady state $V_{READ}$ shift values (e.g., when the bit is a one). This simple example shows how the memory controller can use current $V_{READ}$ voltage for pages 1-2175, and a $V_{READ}$ voltage adjusted as indicated by CVDDE register 0x112 for even pages 2176-2186, and a $V_{READ}$ voltage adjusted as indicated by CVDDE register 0x113 for odd pages 2177-2187. One skilled in the art will recognize based on this example and the disclosure herein that any suitable number of CVDDE registers could be defined to provide different $V_{READ}$ values or adjustments for any suitable CVDDE in any suitable region of the flash memory device.

Figure 14:
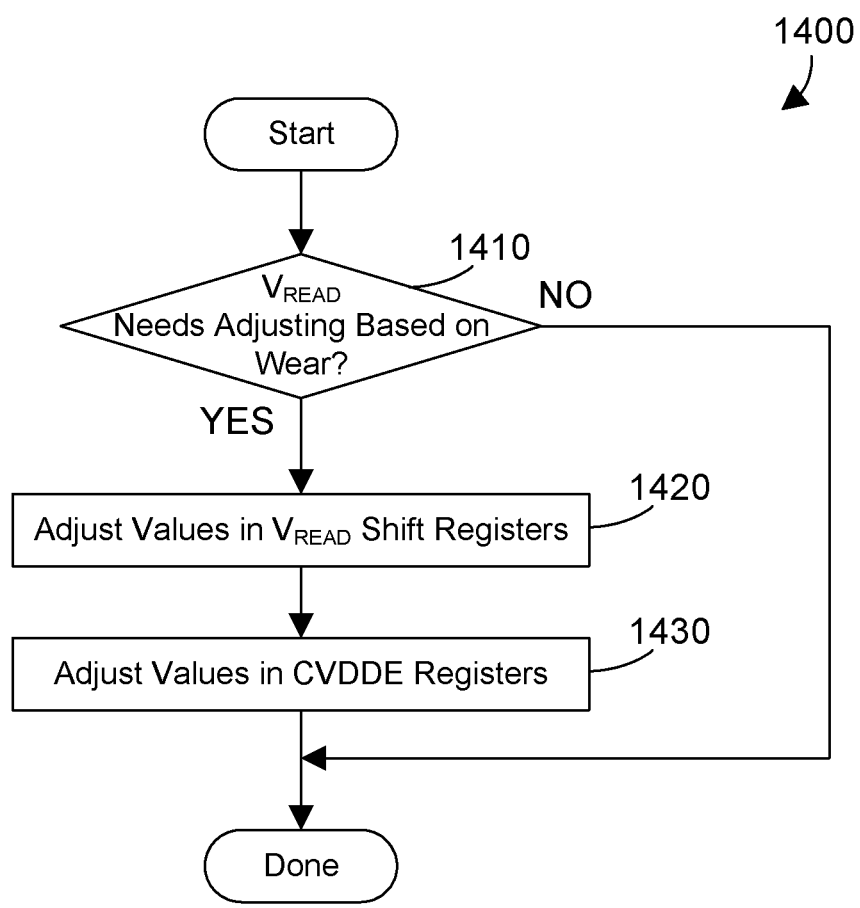
FIG. 14 is a flow diagram of a method for adjusting both read voltage shift values and CVDDE values according to wear of a NAND flash memory device.

Wear is a well-known concept in NAND flash memory devices, which is a function of the number of program-erase cycles on the device. It is well-known that wear in a NAND flash memory device causes a shift in $V_{READ}$ voltage. It is also well-known to adjust $V_{READ}$ shift values to account for wear, as shown in FIG. 5 and discussed above. Because the NAND flash memory device 100 in FIG. 1 and described above includes mechanisms for adjusting $V_{READ}$ based on both device characterization and also based on CVDDEs, a new method is needed to account for wear in the NAND flash memory device 100. Referring to method 1400 in FIG. 14, when $V_{READ}$ does not need to be adjusted based on wear (step 1410=NO), method 1400 is done. When $V_{READ}$ needs adjusting based on wear (step 1410=YES), the values in the $V_{READ}$ shift registers are adjusted (step 1420), and the values in the CVDDE registers are also adjusted (step 1430). This means the values in the first set of registers, the $V_{READ}$ shift registers 122 in FIG. 1, are adjusted in step 1410, and the values in the second set of registers, the CVDDE registers 124, are adjusted in step 1420. Adjusting the values in both the $V_{READ}$ shift registers 122 and the CVDDE registers 124 as the NAND flash memory 100 wears allows dynamically compensating for wear.

A NAND flash memory device detects the occurrence of Cell Voltage Distribution Disruption Events (CVDDEs), such as a Partial Block Program (PBP) and Program-Read-Immediate (PRI), and provides a way to dynamically adjust read voltage to account for CVDDEs. A read command includes extended addressing bits that are used when a CVDDE has occurred to access registers that indicate an adjustment to read voltage that is needed to accommodate the CVDDE. The read voltage is then dynamically adjusted to accommodate the CVDDE. When the CVDDE is no longer an issue, the read voltage is adjusted to its previous value before the CVDDE.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. A flash memory device comprising:
    a plurality of blocks of memory cells, each memory cell storing a plurality of voltage values that represent a plurality of bits;
    first registers that contain values that indicate how to change read voltage according to address of memory cells in the flash memory device and according to a number of program-erase cycles;
    second registers that contain values that indicate how to change read voltage according to a plurality of Cell Voltage Distribution Disruption Events (CVDDEs); and
    a read voltage adjustment mechanism that adjusts read voltage according to the values in the first registers for a selected address when no CVDDE has occurred that affects the selected address, and that receives an indication when a CVDDE occurs that affects the selected address, and in response, adjusts the read voltage according to the values in the second registers for the selected address.

2. The flash memory device of claim 1 wherein the plurality of CVDDEs includes a partial block program when some but not all memory cells in one of the plurality of blocks of memory cells are programmed.

3. The flash memory device of claim 1 wherein the plurality of CVDDEs includes a Program-Read-Immediate where memory cells are read immediately after programming.

4. The flash memory device of claim 1 further comprising a read command that includes an address of a set of memory cells to be read and an extended address that identifies which of the second registers to use by the read voltage adjustment mechanism to adjust the read voltage.

5. The flash memory device of claim 4 wherein the extended address contains a null value that indicates the extended address does not identify any of the second registers, resulting in the read voltage adjustment mechanism not adjusting the read voltage due to CVDDE.

6. The flash memory device of claim 1 wherein the second registers contain values of voltage changes that are significantly greater than values of voltage changes in the first registers.

7. The flash memory device of claim 1 wherein the read voltage adjustment mechanism detects wear as a function of a number of times any of the plurality of blocks of memory cells has been programmed and as a function of bit rate error of any of the plurality of blocks of memory cells.

8. The flash memory device of claim 7 wherein the values in the first registers and the second registers are changed with detected wear of the flash memory device.

9. The flash memory device of claim 1 further comprising a CVDDE occurrence table that logs occurrence of CVDDEs for each of the plurality of blocks of memory cells.

10. The flash memory device of claim 1 wherein the second registers contain values of voltage changes at least twice the values of voltage changes in the first registers.

11. A flash memory device comprising:
a plurality of blocks of memory cells, each memory cell storing a plurality of voltage values that represent a plurality of bits;
first registers that contain values that indicate how to change read voltage according to address of memory cells in the flash memory device and according to a number of program-erase cycles;
second registers that contain values that indicate how to change read voltage according to a plurality of Cell Voltage Distribution Disruption Events (CVDDEs);
a page read command generator that generates a read command for the selected address that includes an address of a set of memory cells to be read and an extended address that identifies which of the second registers to use by a read voltage adjustment mechanism to adjust the read voltage;
when the extended address contains a null value, the read voltage adjustment mechanism adjusts the read voltage using at least one value in the first registers; and
when the extended address identifies at least one of the second registers, the read voltage adjustment mechanism adjusts the read voltage using at least one value in the at least one of the second registers.

12. The flash memory device of claim 11 wherein the values in the first registers and the second registers are changed with detected wear of the flash memory device.

13. A flash memory device comprising:
a plurality of blocks of memory cells, each memory cell storing a plurality of voltage values that represent a plurality of bits;
first registers that contain values that indicate how to change read voltage according to address of memory cells in the flash memory device and according to a number of program-erase cycles;
second registers that contain values that indicate how to change read voltage when a Program-Read-Immediate operation is performed, wherein the second registers contain values of voltage changes that are at least twice the values of voltage changes in the first registers;
a read voltage adjustment mechanism that adjusts read voltage according to the values in the first registers for a selected address when no Program-Read-Immediate has occurred that affects the selected address, and that receives an indication when a Program-Read-Immediate occurs that affects the selected address, and in response, adjusts the read voltage according to the values in the second registers for the selected address, wherein the read voltage adjustment mechanism detects wear as a function of a number of times any of the plurality of blocks of memory cells has been programmed and as a function of bit rate error of any of the plurality of blocks of memory cells; and
a read command that includes an address of a set of memory cells to be read and an extended address that identifies which of the second registers to use by the read voltage adjustment mechanism to adjust the read voltage.

14. The flash memory device of claim 12 wherein the values in the first registers and the second registers are changed with detected wear of the flash memory device.

* * * * *